United States Patent [19]

Yamaguchi

[11] 4,227,227
[45] Oct. 7, 1980

[54] PROTECTIVE CIRCUIT FOR A POWER AMPLIFIER

[75] Inventor: Hiroyasu Yamaguchi, Yokohama, Japan

[73] Assignee: Tokyo Shibaura Denki Kabushiki Kaisha, Kawasaki, Japan

[21] Appl. No.: 922,591

[22] Filed: Jul. 6, 1978

[30] Foreign Application Priority Data

Jul. 12, 1977 [JP] Japan .................................. 52-83266
Jul. 12, 1977 [JP] Japan .................................. 52-83268

[51] Int. Cl.$^2$ ............................................. H02H 7/20
[52] U.S. Cl. .................................. 361/86; 330/207 P; 361/98
[58] Field of Search ...................... 361/86, 91, 98, 78; 330/207 P

[56] References Cited

U.S. PATENT DOCUMENTS

| Re. 27,972 | 4/1973 | Borror et al. | 361/91 |
| 3,500,218 | 3/1970 | Burwen | 330/207 P |
| 3,536,958 | 10/1970 | Sondermeyer | 330/207 P |
| 3,633,093 | 1/1972 | Templeton, Jr. et al. | 361/91 X |
| 3,814,987 | 6/1974 | Chacon | 361/91 X |
| 3,814,988 | 6/1974 | Ito | 330/207 P X |
| 3,898,532 | 8/1975 | Frank | 330/207 P X |
| 3,924,159 | 12/1975 | Hoover | 330/207 P X |

FOREIGN PATENT DOCUMENTS 45-26728 10/1970 Japan .
47-16721 5/1972 Japan .
52-15155 2/1977 Japan .

Primary Examiner—Patrick R. Salce
Attorney, Agent, or Firm—Cushman, Darby & Cushman

[57] ABSTRACT

A protective circuit for a push-pull power amplifier comprises a load current-detecting resistor connected between the emitters of two transistors jointly constituting the power amplifier, a switch connected between an intermediate point on the load current-detecting resistor and the ground to shut off load current, a load resistance-detecting circuit for detecting the resistance of the load, and a driving circuit for causing the switch to be opened by an output from the load resistance-detecting circuit when the resistance of the load falls below a prescribed level. The load resistance-detecting circuit includes means for drawing out a first signal from one end of the load current-detecting resistor and, means for drawing out a second signal with lower potential than the first signal from the other end of the detecting resistor. Further, control means is provided for controlling the potential of the first signal according to that of the second signal, thereby increasing the potential difference between the first and second signals above a prescribed value when the resistance of the load falls below a predetermined value. The driving circuit which is supplied with the first and second signals opens the switch when the potential difference between both signals rises above a prescribed level.

8 Claims, 5 Drawing Figures

PROTECTIVE CIRCUIT FOR A POWER AMPLIFIER

BACKGROUND OF THE INVENTION

This invention relates to a protective circuit for protecting a push-pull type power amplifier, and more particularly to a protective circuit for a power amplifier which can decrease voltage impressed on a semiconductor element constituting the protective circuit.

An audio power amplifier used to date has the arrangement shown in FIG. 1. According to the prior art audio power amplifier, a load current-detecting resistor $R_E$ ($R_E = r_E + r_E$) is connected between the emitter of a transistor of first conductivity type whose collector is connected to a positive power source $+V_{CC}$ and the emitter of a transistor of second conductivity type whose collector is connected to a negative power source $-V_{EE}$. A switch S is connected between an intermediate point on the resistor $R_E$ and a load L (speaker SP), one end of which in grounded. A collector-emitter circuit of a transistor $Q_3$ for detecting the resistance of the load L, for example, the short-circuiting thereof is connected through a resistor between the intermediate point on the resistor $R_E$ and the positive power source $+V_{CC}$. The base of the transistor $Q_3$ is connected to a junction of resistors Ra, Rb collectively constituting an attenuator. A coil 17 for operating the switch S is connected to the positive power source $+V_{CC}$ through a driving transistor $Q_4$. The base of this driving transistor $Q_4$ is supplied with an output from the collector of the transistor $Q_3$. Where the load L is short-circuited, the transistor $Q_4$ is put into operation to open the switch S, thereby protecting the power amplifier. This protective operation is undertaken when the following formula is satisfied:

$$r_E I_0 - \alpha v_0 \geq V_{TH}$$

where:
- $r_E$ = resistance of the resistor $r_E$ of FIG. 1
- $I_0$ = load current
- $\alpha$ = coefficient defined mainly by the resistances Ra, Rb of the attenuator of FIG. 1
- $v_0$ = interterminal voltage of the load L
- $V_{TH}$ = threshold voltage of the transistor $Q_3$, namely, a detecting level of the load resistance.

As apparent from the above formula, the switch S is immediately opened when the load is short-circuited, and the load resistance is substantially reduced to zero to allow the passage of large load current.

Where the protective circuit is integrated, it is necessary to use a semiconductor element of low withstand voltage and reduce the power consumption of the protective circuit. In this connection, the transistor $Q_3$ of the prior art protective circuit of FIG. 1 is discussed below. The voltage applied between the collector and emitter of the transistor $Q_3$ varies between the voltage $+V_{CC}$ of the positive power source and the voltage $-V_{EE}$ of the negative power source, therefore the withstand voltage $BV_{CEO}$ between the collector and emitter regions is required to have as large a value as $V_{CC}+V_{EE}$, where, therefore, the protective circuit is integrated, the withstand voltage of the transistor $Q_3$ has to be raised to the above-mentioned high level. This means that a large chip has to be used, increasing the cost of an integrated protective circuit. Further drawbacks of the prior art protective circuit are that if high voltage has to be impressed on a semiconductor element, power consumption will rise, making it necessary to use a package of low thermal resistance; special means should be provided to promote heat dissipation; and the internal resistance of the semiconductor element itself should be decreased to admit of application of small operating current. Therefore, the arrangement of the prior art protective circuit shown in FIG. 1 can not be regarded as adapted for integration.

It is accordingly the object of this invention to provide a protective circuit for a power amplifier which can be formed of a semiconductor element having a relatively low withstand voltage.

SUMMARY OF THE INVENTION

According to this invention, there is provided a protective circuit which comprises a load currentdetecting resistor connected between two transistors jointly constituting a push pull power amplifier for detecting the load current of the power amplifier; a load connected to the power amplifier through the load current-detecting resistor; a switch for shutting off the load current; a load resistance-detecting circuit for detecting the resistance of the load; and a driving circuit for causing the switch to be opened by an output from the load resistance-detecting circuit when the load resistance falls to a lower level than prescribed; wherein the load resistance-detecting circuit comprises a circuit means for drawing out a first signal from one end of the load current-detecting resistor, circuit means for drawing out a second signal of lower potential than the first signal from the other end of the load current-detecting resistor, and control circuit means, which, when the load has a higher resistance than prescribed holds the potential difference between the first and second signals to be lower than a predetermined level by causing the potential of the first signal to drop by the second signal of lower potential than the first signal, and, when the load has a lower resistance than prescribed, increases the potential difference between the first and second signals over the predetermined level; and the driving circuit is supplied with the first and second signals, and includes circuit means for opening the switch, when the potential difference between the first and second signals has a larger value than the predetermined value.

DETAILED DESCRIPTION OF THE PREFERRED EMBODIMENTS

Figure 2:
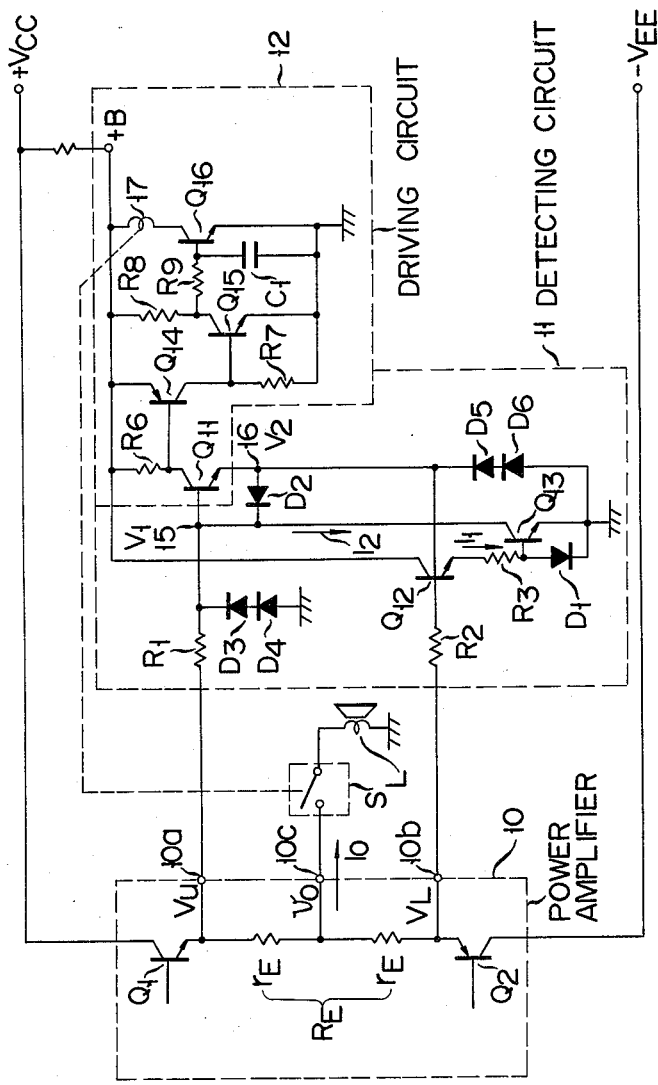
FIG. 2 indicates the arrangement of a protective circuit according to one embodiment of this invention which protects a power amplifier by detecting a load resistance during the positive halfwave period of load current.

Referring to FIG. 2, a detecting resistor $R_E$ ($R_E=2r_E$) for detecting load current $I_0$ is connected between the emitter of an NPN transistor $Q_1$ and that of a PNP transistor $Q_2$. The base of each of said transistors $Q_1$, $Q_2$ receives an input signal. Positive voltage is impressed from a positive power source $+V_{CC}$ on the collector of the NPN transistor $Q_1$. Negative voltage is supplied from a negative power source $-V_{EE}$ to the collector of the PNP transistor $Q_2$. A switch S for cutting off a load current is connected between an intermediate point on the resistor $R_E$ and a load L (speaker), one end of which is grounded. The switch S is actuated by a coil 17 through which current passes. Reference numeral 11 denotes a detecting circuit for detecting load resistance, and reference numeral 12 represents a driving circuit for driving the switch S. A potential at the junction 10a between the emitter of the NPN transistor $Q_1$ and resistor $R_E$ is indicated by $V_u$; a potential at the junction 10b between the emitter of the PNP transistor $Q_2$ and resistor $R_E$ by $V_L$; a potential at an intermediate point of the resistor $R_E$, namely, a nongrounded point 10c of the load L by $v_0$; and load current by $I_0$. The junction 10a and a point 15 are connected together through a resistor $R_1$. A first signal $V_1$ is drawn out from the terminal 15. The junction 10b and point 16 are connected together through a resistor $R_2$. A second signal $V_2$ is drawn out from the point 16. The point 15 is connected to the base of a transistor $Q_{11}$, whose collector is connected through a resistor $R_6$ to a positive power source +B having a lower voltage than $+V_{CC}$, and whose emitter is connected to the point 16. A diode $D_2$ of the indicated polarity is connected between the points 15, 16.

The point 15 is grounded through diodes $D_3$ and $D_4$ with the indicated polarity and the point 16 is grounded through diodes $D_5$ and $D_6$ with the indicated polarity. The point 16 is connected to the base of a transistor $Q_{12}$ whose collector is connected to the positive power source +B, and whose emitter is grounded through a resistor $R_3$ and diode $D_1$ of the indicated polarity. The base of a transistor $Q_{13}$ is connected to a junction between the resistor $R_3$ and diode $D_1$; the collector thereof is connected to the point 15 and to the point 16 through the diode $D_2$ of the indicated polarity; and the emitter thereof is grounded. The base-emitter circuit of the transistor $Q_{13}$ is connected in parallel to the diode $D_1$ to form a current mirror. The collector of the transistor $Q_{11}$ is connected to the base of a transistor $Q_{14}$, whose emitter is connected to the positive power source +B and whose collector is grounded through a resistor $R_7$, and is also connected to the base of a transistor $Q_{15}$: The collector of this transistor $Q_{15}$ is connected to the positive power source +B through a resistor $R_8$ and also to the base of a transistor $Q_{16}$ through a resistor $R_9$. The emitter of the transistor $Q_{15}$ is grounded. The collector of the transistor $Q_{16}$ is connected to the positive power source +B through the coil 17 for driving the switch S and the emitter thereof is grounded. A capacitor $C_1$ is connected between the base of the transistor $Q_{16}$ and the ground.

There will not be described the operation of the embodiment of FIG. 2 For better understanding, brief description is given of the case where the load L has a prescribed resistance and the case where the load L is short-circuited. Description is first given of the case where the load has a normal resistance, and the nongrounded terminal has a positive polarity. In this case, there result $V_u > v_0$ and $V_L = v_0$. Accordingly, the transistors $Q_{12}$, $Q_{13}$ are in active regions. Referring to the transistor $Q_{13}$, current $I_2$ flows through the resistor $R_1$ in the indicated direction. Therefore, the potential $V_1$ at the point 15 decreases from the potential $V_u$ by a voltage drop at the resistor $R_1$. Accordingly, a potential difference $V_1 - V_2$ between the potential $V_1$ at the point 15 and the potential $V_2$ at the point 16 can be made to fall short of a threshold voltage $V_{BE}$ between the base and emitter of the transistor $Q_{11}$. This arrangement enables the transistor $Q_{11}$ to be nonconducting, and in consequence the transistors $Q_{14}$, $Q_{15}$ to be nonconducting and the transistor $Q_{16}$ to be conducting. The switch S is closed when current is conducted through the coil 17, and is opened when no current passes through the coil 17. Therefore, the switch remains closed when the load has a higher resistance than prescribed.

Where the load L is short-circuited, a voltage drop appears at the junction 10a due to short circuit current running through the detecting resistor $R_E$. As the result, the voltages $V_0$, $V_L$ are reduced to zero, the transistors $Q_{12}$, $Q_{13}$ are rendered nonconductive and current $I_2$ ceases to run. Therefore, the potential $V_1$ at the point 15 is increased to the potential $V_u$ at the junction 10a. Since the potential difference $V_1 - V_2$ increases over the threshold voltage $V_{BE}$ of the transistor $Q_{11}$, the transistor $Q_{11}$ is rendered conducting when the transistors $Q_1$, $Q_2$ are supplied with a signal. In this case, the transistors $Q_{14}$, $Q_{15}$ are rendered conducting and the transistor $Q_{16}$ is rendered nonconducting, and the switch is opened.

There will now be described the general case where the load L has an optional resistance. The potential $V_u$ at the junction 10a is expressed by the following equation:

$$V_u = r_E I_0 + V_0 \tag{1}$$

Assuming $v_0 \geq 2V_{BE}$ ($V_{BE}$ denotes a voltage between the base and emitter or threshold voltage of the transistor $Q_{11}$) and with the ratio between current $I_1$ flowing through the diode $D_1$ and current $I_2$ flowing through the transistor $Q_{13}$ set at N, namely, $I_1 = NI_2$, then the base potential $V_1$ of the transistor $Q_{11}$ is expressed by the following equation:

$$V_1 = v_0 + r_E I_0 R_1 \left( \frac{v_0 - 2V_{BE}}{NR_3} \right) \tag{2}$$

Since $V_2 = v_0$, a potential difference $V_1 - V_2$ between the base and emitter of the transistor $Q_{11}$ is expressed by the following equation:

$$V_1 - V_2 = r_E I_0 - \frac{R_1}{NR_3} v_0 + \frac{2R_1}{NR_3} V_{BE} \tag{3}$$

When the potential difference $V_1 - V_2$ increases over $V_{BE}$, the transistor $Q_{11}$ is rendered conducting and the switch S is opened. The above equation (3) may be rewritten as follows $$r_E I_0 \geq \frac{R_1}{NR_3} v_0 + \left(1 - \frac{2R_1}{NR_3}\right) V_{BE} \tag{4}$$

As seen from the above equation (4), where an output voltage $v_0$ has a high level, large current can be conducted through the output transistors of a power amplifier where said putput voltage $v_0$ has a low level, the protective ciucuit is operated, even when small current flows through the output transistors of the power amplifier.

In the region expressed by the following equation (5) where the output voltage $v_0$ has a high level $$\frac{R_1}{NR_3} v_0 > (1 - \frac{2R_1}{NR_3}) V_{BE} \qquad (5)$$

the following equation results:

$$r_E \cdot I_0 \geq \frac{R_1}{NR_3} v_0 \qquad (6)$$

Derived from the above equation (6) is the following equation:

$$R_L (= \frac{v_0}{I_0}) \leq \frac{NR_3}{R_1} r_E \qquad (7)$$

It is seen from the above equation (7) that the resistance $R_L$ of the load L is equal to or smaller than $(NR_3/R_1)r_E$, the protective circuit is put into operation.

Referring to FIG. 2, the diode $D_2$ prevents the transmission of excess back bias between the base and emitter of the transistor $Q_{11}$. A group of diodes $D_3$ and $D_4$ suppresses the supply of excess back bias to the base of the transistor $Q_{11}$, and a group of diodes $D_5$ and $D_6$ suppresses the supply excess back bias to the emitter of the same transistor $Q_{11}$.

The transistor $Q_{12}$ acts as a sort of a buffer element substantially to eliminate the effect of voltage drop at the resistor $R_2$ connected between the junction 10b and point 16, and may therefore be omitted. Further, it is possible to use a differential amplifier in place of the transistor $Q_{11}$. This arrangement enables the potential difference $V_1 - V_2$ to be detected more minutely. Namely, the transistor $Q_{11}$ detects the potential difference $V_1 - V_2$ substantially to the extent of 600 mV, where as the differential amplifier detects the potential difference $V_1 - V_2$ to the extent of about 100 mV.

The embodiment of FIG. 2 is designed to detect load resistance during the positive halfwave period of output current. Where the polarity of the diodes and transistor is reversed, then the embodiment can be so modified as to detect load resistance during the negative halfwave period of output current. Further, where it is desired to detect load resistance only during the positive halfwave period of output current, then the resistor $R_2$ may obviously be connected to the point 10c in place of the junction 10b.

It is seen from the foregoing embodiment that this invention enables a withstand voltage demanded for the transistor $Q_{11}$ to be lower than a sum of absolute values of power source voltage levels $+V_{CC}$ and $-V_{EE}$, and in consequence withstand voltage demanded for other transistors included in a protective circuit to be lower than $V_{CC}$ and $V_{EE}$. Therefore, this invention decrease the power consumption of a protective circuit. For the foregoing reason, a protective circuit embodying this invention can be easily integrated. Where the resistors $R_1$, $R_2$ are provided as external elements of an integrated protective circuit, then the level for detecting a load resistance can be easily set.

There will now be described by reference to FIG. 3 a protective circuit according to another embodiment which can detect load resistance during the positive and negative halfwave periods of an output voltage $v_0$. This embodiment is characterized in that the first and second signals are drawn out through the first and second attenuators from the corresponding terminals of a detecting resistor, thereby decreasing a withstand voltage demanded for the transistors constituting a protective circuit.

Figure 3:
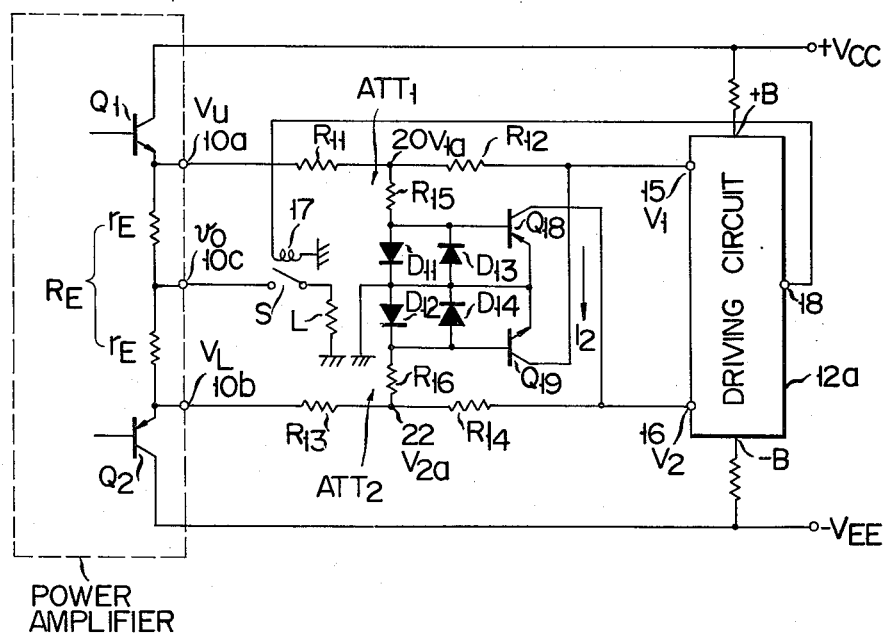
FIG. 3 sets forth the arrangement of a protective circuit according to another embodiment of the invention which protects a power amplifier by detecting a load resistance during the positive and negative halfwave periods of load current.

Referring to FIG. 3, one end 10a of a load current-detecting resistor $R_E$ is connected to a first attenuator $ATT_1$ consisting of resistors $R_{11}$, $R_{15}$. A first signal $V_1$ is conducted through a junction 20 between both resistors $R_{11}$, $R_{15}$ and also through a resistor $R_{12}$ to be drawn out at a terminal 15. The other end 10b of the load current-detecting resistor $R_E$ is connected to a second attenuator consisting of resistors $R_{13}$, $R_{16}$. A second signal $V_2$ passes through a junction 22 between both resistors $R_{13}$, $R_{16}$ and also through a resistor $R_{14}$ to be drawn out at a terminal 16. A load L, one end of which is grounded is connected to an intermediate point 10c on the resistor $R_E$ through a switch S. A voltage $v_0$ is impressed between both terminals of the load L. Connected between the free ends of the resistors $R_{15}$, $R_{16}$ are a group of diodes $D_{11}-D_{12}$ and another group of diodes $D_{13}-D_{14}$ with opposite polarities as shown in FIG. 3. The base of a PNP transistor $Q_{18}$ is connected to the free end of the resistor $R_{15}$, and the base-emitter circuit thereof is connected in parallel to the diode $D_{13}$, thereby constituting a current mirror circuit. The collector of the PNP transistors $Q_{18}$ is connected to the output terminal 16 of the second signal $V_2$. The base of an NPN transistor $Q_{19}$ is connected to the free end of the resistor $R_{16}$, and the base-emitter circuit thereof is connected in parallel to the diode $D_{14}$, thereby forming a current mirror circit. The collector of the NPN transistor $Q_{19}$ is connected to the output terminal 15 of the first signal $V_1$. The emitters of the transistors $Q_{18}$, $Q_{19}$ are jointly connected to the junction of the series-connected group of diodes $D_{11}-D_{12}$ and also to the junction of the series-connected group of diodes $D_{13}-D_{14}$, and further grounded. The diode $D_{11}$ is rendered conducting during the positive halfwave period of load current. The diode $D_{12}$ is operated during the negative halfwave period of load current. The diode $D_{11}$ actuates the attenuator $ATT_1$ during the positive halfwave period of load current the diode $D_{14}$ puts the attenuator $ATT_2$ into operation during the negative halfwave period of load current. The output terminal 18 of the driving circuit 12a is connected to one end of the driving coil 17 of the switch S. The other end of the coil 17 is grounded. The driving circuit indicated by referential numeral 12 in FIG. 2 and that shown in FIG. 4 may be used as a driving circuit 12a shown in FIG. 3.

Figure 4:
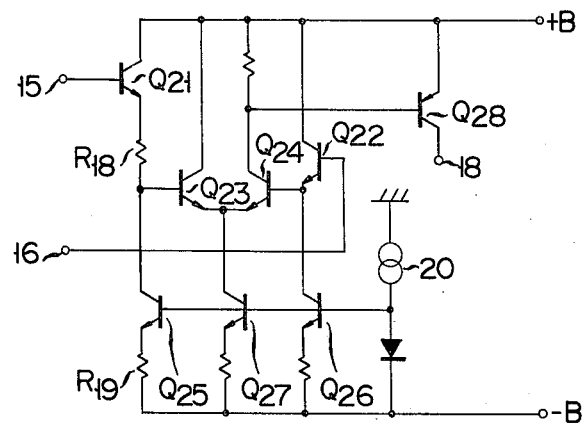
FIG. 4 is a diagram of the driving circuit of FIG. 3.

Referring to FIG. 4, the base of an NPN transistor $Q_{21}$ is connected to the output terminal 15 of the first signal $V_1$, the collector thereof to the positive power source $+B$, and the emitter thereof to the negative power source $-B$ through a resistor $R_{18}$, NPN transistor $Q_{25}$ and resistor $R_{19}$ in turn. NPN transistors $Q_{23}$, $Q_{24}$ jointly constitute a differential amplifier. The collector of the transistor $Q_{23}$ is directly connected to the positive power source $+B$. The collector of the transistor $Q_{24}$ is connected to the positive power source $+B$ through the corresponding collector resistor. The emitter of both transistors $Q_{23}$, $Q_{24}$ are jointly connected to the nagative power source $-B$ through an NPN transistor $Q_{27}$. The base of the transistor $Q_{22}$ is connected to the output terminal 16 of the second signal; the collector thereof directly to the positive power source +B; and the emitter thereof is connected to the base of the transistor $Q_{24}$, and also to the negative power source −B through an NPN transistor $Q_{26}$. The base of a PNP transistor $Q_{28}$ is connected to the collector of the transistor $Q_{23}$, and the emitter thereof is connected to the nongrounded end of the driving coil 17 of the switch S through the output terminal 18. A constant current source 20, one end of which is grounded, is connected to the negative power source −B through the indicated diode. An output from the constant current source 20 is supplied in common to the bases of transistors $Q_{25}$, $Q_{27}$, $Q_{26}$ arranged in the order mentioned.

Reverting to FIG. 3, a potential $V_{1a}$ at the output terminal 20 of the first attenuator $ATT_1$ and a maximum potantial $V_{2a}$ at the output terminal 22 of the second attenuator $ATT_2$ are expressed by the following equations respectively with a voltage drop at the diodes $D_{11}$ to $D_{14}$ disregarded.

$$V_{1a} = \frac{R_{15}}{R_{11} + R_{15}} V_{CC}$$

$$V_{2a} = \frac{R_{16}}{R_{15} + R_{16}} (-V_{EE})$$

Therefore, source voltages +B, −B required for the driving circuit 12a are expressed as follows:

$$+B \geqq \frac{R_{15}}{R_{11} + R_{15}} V_{CC}$$

$$-B \geqq \frac{R_{16}}{R_{13} + R_{16}} (-V_{EE})$$

Figure 1:
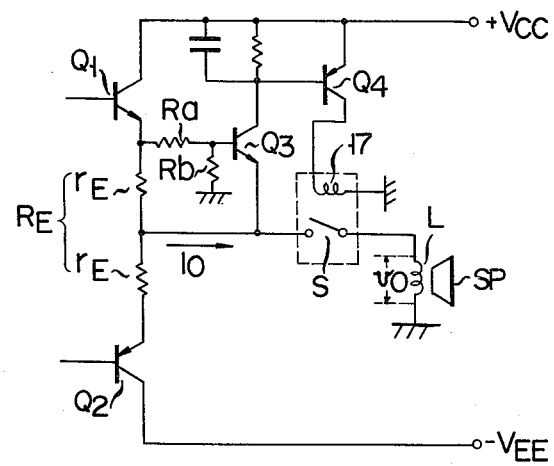
FIG. 1 shows the arrangement of the prior art protective circuit for a power amplifier.

Assuming $+V_{CC} = 50$ V, $-V_{EE} = -50$ V, and $$\frac{R_{15}}{R_{11} + R_{15}} = \frac{R_{16}}{R_{13} + R_{16}} = \frac{1}{5},$$

the equation of $+B \geqq 10$ V and $-B \geqq -10$ V are satisfied. The transistors constituting the driving circuit 12a have only to be provided with a withstand voltage of 24 V, even if a margin of ±20 V is allowed. Therefore, it will well serve the purpose if the transistors have a withstand voltage of 30 V. With the prior art protective circuit of FIG. 1, the transistor $Q_3$ is impressed with a voltage of ±50 V. That is, the transistor $Q_{13}$ must have a withstand voltage of 100 V. Therefore, the protective circuit of this invention arranged as shown in FIG. 3 is obviously more adapted for integration. To effect said integration, it is better to set the resistors $R_{11}$, $R_{13}$ outside of an integrated protective circuit.

A potential difference $V_1 - V_2$ between the first signal $V_1$ and the second signal $V_2$ which arises during the positive halfwave period of load current is expessed by the following equation (8) (assuming $R_{11} = R_{13}$ and $R_{15} = R_{16}$):

$$V_1 - V_2 = \frac{R_{15}}{R_{11} + R_{15}} \left\{ r_E I_0 - \frac{\frac{R_{11} \times R_{15}}{R_{11} \times R_{15}} + r_{12}}{Na(R_{11} + R_{15})} (V_0 - V_{BE}) \right\} \quad (8)$$

where, Na is a ratio between current running through the diode $D_{14}$ and current flowing through the transistor $Q_{19}$. Said ratio can generally be defined changing a ratio between the areas of the emitters of the diode $D_{14}$ and transistor $Q_{19}$ during their manufacture. $V_{BE}$ denotes a voltage impressed across the base and emitter of the transistor $Q_{19}$, namely a threshold voltage thereof. The potential difference $V_2 - V_1$ between the potential $V_2$ of the second signal and the potential $V_1$ of the first signal can be determined during the negative halfwave period of load current by modifying the above equation (8). In this case, it is advised to cause Na to represent a ratio between current flowing through the diode $D_{13}$ and current conducted through the transistor $Q_{18}$.

The potentials $V_u$, $V_L$ of the emitters of the transistors $Q_1$, $Q_2$ jointly constituting a power amplifier which appear during the positive halfwave period of load voltage (load current) are expressed as follows:

$$V_u = r_E \cdot I_0 + V_0$$

$$V_L = V_0$$

Where, therefore, the driving circuit 12a is designed to produce an output in case of $V_1 - V_2 \geqq V_{th}$ ($V_{th}$ represents a detecting voltage of the driving circuit), then the follwoing equation (9) results:

$$r_E \cdot I_0 - \frac{1}{K} v_0 \geqq \frac{R_{11} + R_{15}}{R_{15}} V_{th} - \frac{1}{K} V_{BE} (\approx V_{th}) \quad (9)$$

where 1/K denotes $$\frac{\frac{R_{11} \times R_{15}}{R_{11} + R_{15}} + R_{12}}{Na(R_{11} + R_{15})}$$

If the resistances of the respective resistors and Na are so defined as to satisfy $1/K \; v_0 > V'_{th}$ then there results $r_E I_0 > 1/K \; v_O$ and in consequence the following formula (10):

$$K \cdot r_E \geqq R_L$$

It is seen from the above formula (10) that where the load resistance $R_L$ has a smaller value than $K \cdot r_E$, then the driving circuit 12a can be operated. The parallel connected diodes $D_{11}$, $D_{13}$ and the parallel connected diodes $D_{12}$, $D_{14}$ have opposite polarities to each other. The resistors $R_{15}$, $R_{16}$ are designed to be operated during the positive and negative halfwave periods of load current respectively. Therefore, load resistance can be detected during the positive or negative halfwave period of load current. The resistors $R_{11}$, $R_{12}$, $R_{15}$ decrease the potential of the first signal during the positive halfwave period of load current as does the resistor $R_1$ of FIG. 2. The resistors $R_{13}$, $R_{14}$, $R_{16}$ act in the same manner during the negative halfwave period of load current. Since a group of the resistors $R_{11}$, $R_{15}$ and a group of resistors $R_{13}$, $R_{16}$ can effect a voltage drop without the resistors $R_{12}$, $R_{14}$ during the positive and negative halfwave periods of load current respectively, the last mentioned two resistors $R_{12}$, $R_{14}$ can be omitted.

Referring to FIG. 3, where the load L has a higher resistance than prescribed, the first signal $V_1$ has its voltage decreased during the positive halfwave period of load current by current passing through the transistor $Q_{19}$ controlled by the signal $V_{2a}$ and resistors $R_{11}$, $R_{12}$. However, the voltage of the second signal $V_2$ does not drop, because the transistor $Q_{18}$ is not rendered conducting. As the result, the transistors $Q_{21}$, $Q_{23}$ are rendered nonconducting and the transistor $Q_{28}$ is rendered conducting. Therefore the switch S is held in closed state. Where the load L is short-circuited, then the transistor $Q_{19}$ is rendered nonconducting to prevent current from running through the resistors $R_{11}$, $R_{12}$, thereby raising the potential of the first signal $V_1$ substantially up to the potential $V_u$. At this time, the transistors $Q_{21}$, $Q_{23}$ are rendered conducting and the transistor $Q_{28}$ is turned off, thereby opening the switch S. The same operations as described above take place during the negative halfwave period of load current.

As described above, the embodiment of FIG. 3 can decrease a withstand voltage demanded for the semiconductor elements constituting a protective circuit.

Figure 5:
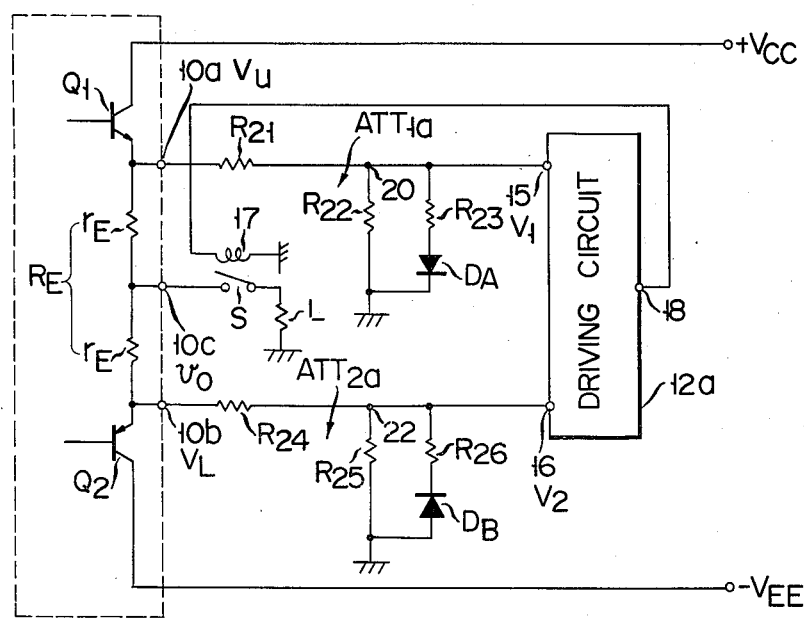
FIG. 5 presents the arrangement of another type of protective circuit for a power amplifier, only the detecting circuit of which is different from that of FIG. 3.

A protective circuit utilizing a potential difference between the first and second signals may comprise the load resistance-detecting circuit of FIG. 5. A junction 10a is connected to a first attenuator $ATT_{1a}$ formed of resistors $R_{21}$, $R_{22}$. The free end of the resistor 22 is grounded. A diode $D_A$ of the indicated polarity is connected in parallel to the resistor $R_{22}$ through a resistor $R_{23}$. A first signal $V_1$ is drawn out from a junction 20 between the resistors $R_{21}$, $R_{22}$. A junction 10b is connected to a second attenuator $ATT_{2a}$ formed of resistors $R_{24}$, $R_{25}$. The free end of the resistor $R_{25}$ is grounded. A diode $D_B$ of the indicated polarity is connected through a resistor $R_{26}$ in parallel to the resistor $R_{25}$. A second signal $V_2$ is drawn out from a junction 22 between the resistors $R_{24}$, $R_{25}$. A driving circuit supplied with the first and second signals has the same arrangement as the driving circuit 12a of FIG. 3. Referring to FIG. 5, the diode $D_A$ is rendered nonconducting and the diode $D_B$ is rendered conducting during the negative halfwave period of load current. During the positive halfwave period of load current, the diode $D_A$ is put into operation, and the diode $D_B$ is turned off. Assuming $R_{21}=R_{24}$, $R_{22}=R_{25}$, $R_{23}=R_{26}$ and $$R_A = \frac{R_{22} \cdot R_{23}}{R_{22} + R_{23}},$$

then the following equation results during the positive halfwave period of load current.

$$V_1 - V_2 \approx \frac{R_A}{R_{21} + R_A} r_E I_0 - \left(\frac{R_{22}}{R_{21} + R_{22}} - \frac{R_A}{R_{21} + R_A}\right) v_0$$

When detected in case of $V_1-V_2 \geq 0$, the load resistance is expressed by the following equation:

$$R_L \approx \frac{V_0}{I_0} \leq K' r_E$$

where K' denotes $$\frac{R_{23} \times (R_{21} + R_{22})}{R_{21} \times R_{22}}$$

The same result as described above is also obtained during the negative halfwave period of load current.

What is claimed is:

1. A protective circuit for a push-pull power amplifier including a load current-detecting resistor connected between two transistors jointly constituting said power amplifier for detecting the load current of said power amplifier; a load connected to said power amplifier through said load current-detecting resistor; a switch for shutting off said load current; a load resistance detecting circuit for detecting the resistance of said load; and a driving circuit for causing said switch to be opened by an output of said load resistance detecting circuit when the resistance of said load falls to a lower level than prescribed, characterized in that said load resistance-detecting circuit comprises circuit means for drawing out a first signal from one end of said load current-detecting resistor; circuit means for drawing out a second signal of lower potential than said first signal from the other end of said load current-detecting resistor; and control circuit means, which, when said load has a higher resistance than prescribed, holds the potential difference between said first and second signals to be lower than a predetermined level by causing the potential of said first singal to drop as a result of control on said first signal by said second signal of lower potential than said first signal, and, when said load has a lower resistance than prescribed, increases the potential difference between said first and second signals over said predetermined level; and said driving circuit is supplied with said first and second signals, and includes circuit means for opening said switch, when the potential difference between said first and second signals has a larger value than said predetermined value.

2. The protective circuit according to claim 1, characterized in that said first signal has its potential decreased by current running through a resistor connected between said one end of said load current-detecting resistor and the terminal from which said first signal is drawn out.

3. The protective circuit according to claim 1, characterized in that said load resistance-detecting circuit detects the load resistance during the positive halfwave period of load current.

4. The protective circuit according to claim 1, characterized in that said load resistance-detecting circuit detects the load resistance during the negative halfwave period of load current.

5. The protective circuit according to claim 1, characterized in that said load resistance-detecting circuit detects the load resistance during the positive halfwave period and also during the negative halfwave period of load current.

6. The protective circuit according to claim 3 or 4, which further comprises diode means for limiting the amplitude of said first and second signals.

7. The protective circuit according to claim 3, characterized in that said load resistance-detecting circuit comprises a first resistor having first and second ends wherein said first end is coupled to one end of said load current-detecting resistor whose potential increases during the positive halfwave period of the load current; a first terminal coupled to said second end of said first resistor for drawing out said first signal; a second resistor having first and second ends wherein said first end is coupled to the other end of said load current-detecting resistor whose potential falls below that of said first signal during the positive halfwave period of the load current; a second terminal coupled to said second end of said second resistor for drawing out said second signal; and a transistor having an emittercollector circuit coupled to said first terminal and which is so controlled as to be rendered conducting when the load has a higher resistance than prescribed thereby drawing current away from said first terminal and rendered nonconducting when the load has a lower resistance than prescribed.

8. The protective circuit according to claim 5, characterized in that said load resistance-detecting circuit comprises a first attenuator connected to said one end of said load current-detecting resistor and constituted by a series circuit of a first resistor and a second resistor said first and second resistors each having first and second ends, said first end of said first resistor coupled to said one end of said load current-detecting resistor and said second end of said first resistor coupled two said first end of said second resistor; a second attenuator connected to said other end of said load current-detecting resistor and constituted by a series circuit of a third resistor and a fourth resistor; a first terminal connected to a junction between the first and second resistors of said first attenuator for drawing out said first signal; a second terminal connected to a junction between the third and fourth resistors of said second attenuator for drawing out said second signal; a first transistor of first conductivity type whose base is coupled to said second end of said second resistor of said first attenuator and whose collectoremitter circuit is coupled between said second terminal and ground; a second transistor of second conductivity type whose base is connected to said second end of said fourth resistor of said second attenuator, and whose collector-emitter circuit is coupled between said first terminal and ground; a pair of diodes connected in parallel with opposite polarities between the base and emitter of the first transistor; and another pair of diodes connected in parallel with opposite polarities between the base and emitter of the second transistor.

* * * * *